United States Patent
Srail

(10) Patent No.: US 9,508,344 B2
(45) Date of Patent: Nov. 29, 2016

(54) AUTOMATIC VOLUME CONTROL BASED ON SPEECH RECOGNITION

(71) Applicant: DELPHI TECHNOLOGIES, INC., Troy, MI (US)

(72) Inventor: Douglas A. Srail, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 59 days.

(21) Appl. No.: 14/514,555

(22) Filed: Oct. 15, 2014

(65) Prior Publication Data

US 2016/0111087 A1     Apr. 21, 2016

(51) Int. Cl.
| | |
|---|---|
| H03G 3/00 | (2006.01) |
| G10L 15/20 | (2006.01) |
| H03G 3/24 | (2006.01) |
| H04R 1/08 | (2006.01) |
| G10L 21/0316 | (2013.01) |
| H03G 3/30 | (2006.01) |
| G10L 25/78 | (2013.01) |
| H04R 9/08 | (2006.01) |
| H04R 1/02 | (2006.01) |
| H04R 29/00 | (2006.01) |
| G10L 25/84 | (2013.01) |

(52) U.S. Cl.
CPC .......... *G10L 15/20* (2013.01); *G10L 21/0316* (2013.01); *G10L 25/78* (2013.01); *H03G 3/24* (2013.01); *H03G 3/3089* (2013.01); *H04R 1/08* (2013.01); *G10L 25/84* (2013.01); *H04R 2430/01* (2013.01)

(58) Field of Classification Search
CPC .. H04R 3/005; H04R 2499/13; H04R 1/406; H04R 2410/05; H04R 2499/11; H04R 29/00; H04R 3/02; H04R 2420/01; H04R 3/04; H04R 1/1083; H04R 2430/01; H04R 25/356; H04R 2410/01; G10L 21/0208; G10L 2021/02082; G10L 2021/02166; G10L 21/02
USPC .......... 381/86, 92, 57, 94.1, 56, 71.1, 122, 381/365, 74.4, 104, 107, 317, 91, 106, 389, 381/58, 73.1, 110, 302, 71.11; 704/226, 704/225, 200, 208, 233; 379/22.08, 390.03, 379/392.01; 455/569.2, 570, 114.2, 296, 455/501, 63.1, 67.13
See application file for complete search history.

(56) References Cited

U.S. PATENT DOCUMENTS

| | | | |
|---|---|---|---|
| 5,054,078 A | 10/1991 | Schorman et al. | |
| 7,085,710 B1 | 8/2006 | Beckert et al. | |
| 2004/0218768 A1* | 11/2004 | Zhurin | H03G 3/32 381/107 |
| 2008/0071547 A1* | 3/2008 | Prieto | B60N 2/002 704/275 |

FOREIGN PATENT DOCUMENTS

JP     2011 015018 A     1/2011

\* cited by examiner

*Primary Examiner* — Paul S Kim
*Assistant Examiner* — Norman Yu
(74) *Attorney, Agent, or Firm* — Lawrence D. Hazelton

(57) ABSTRACT

An entertainment system suitable for use in a vehicle and configured to control an output volume of the system includes a microphone and a processor. The microphone is configured to detect sound in a cabin of the vehicle, and output a microphone signal indicative of the sound. The processor is configured to determine a difference signal based on a difference between the microphone signal and an output signal corresponding to sound being output by the system, determine if the difference signal corresponds to human speech, and decrease the output volume of the system when the difference signal corresponds to human speech.

4 Claims, 3 Drawing Sheets

AUTOMATIC VOLUME CONTROL BASED ON SPEECH RECOGNITION

TECHNICAL FIELD OF INVENTION

This disclosure generally relates to an entertainment system, and more particularly relates to a system configured to decrease the output volume of the entertainment system when human speech is detected.

BACKGROUND OF INVENTION

Entertainment systems installed in automobiles and other vehicles that adjust the output volume based on vehicle speed are known. However, if persons in the vehicle begin to converse or participate in a phone conversation, the output volume may be too loud.

SUMMARY OF THE INVENTION

In accordance with one embodiment, an entertainment system suitable for use in a vehicle is provided. The system is configured to control an output volume of the system. The system includes a microphone and a processor. The microphone is configured to detect sound in a cabin of the vehicle, and output a microphone signal indicative of the sound. The processor is configured to determine a difference signal based on a difference between the microphone signal and an output signal corresponding to sound being output by the system, determine if the difference signal corresponds to human speech, and decrease the output volume of the system when the difference signal corresponds to human speech.

In another embodiment, a method for controlling an output volume of an entertainment system suitable for use in a vehicle is provided. The method includes the step of receiving a microphone signal from a microphone configured to detect sound in a cabin of the vehicle. The method also includes the step of determining a difference signal based on a difference between the microphone signal and an output signal corresponding to sound being output by the system. The sound being output by the system is characterized by an output volume. The method also includes the step of determining if the difference signal corresponds to human speech. The method also includes the step of decreasing the output volume of the system when the difference signal corresponds to human speech.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
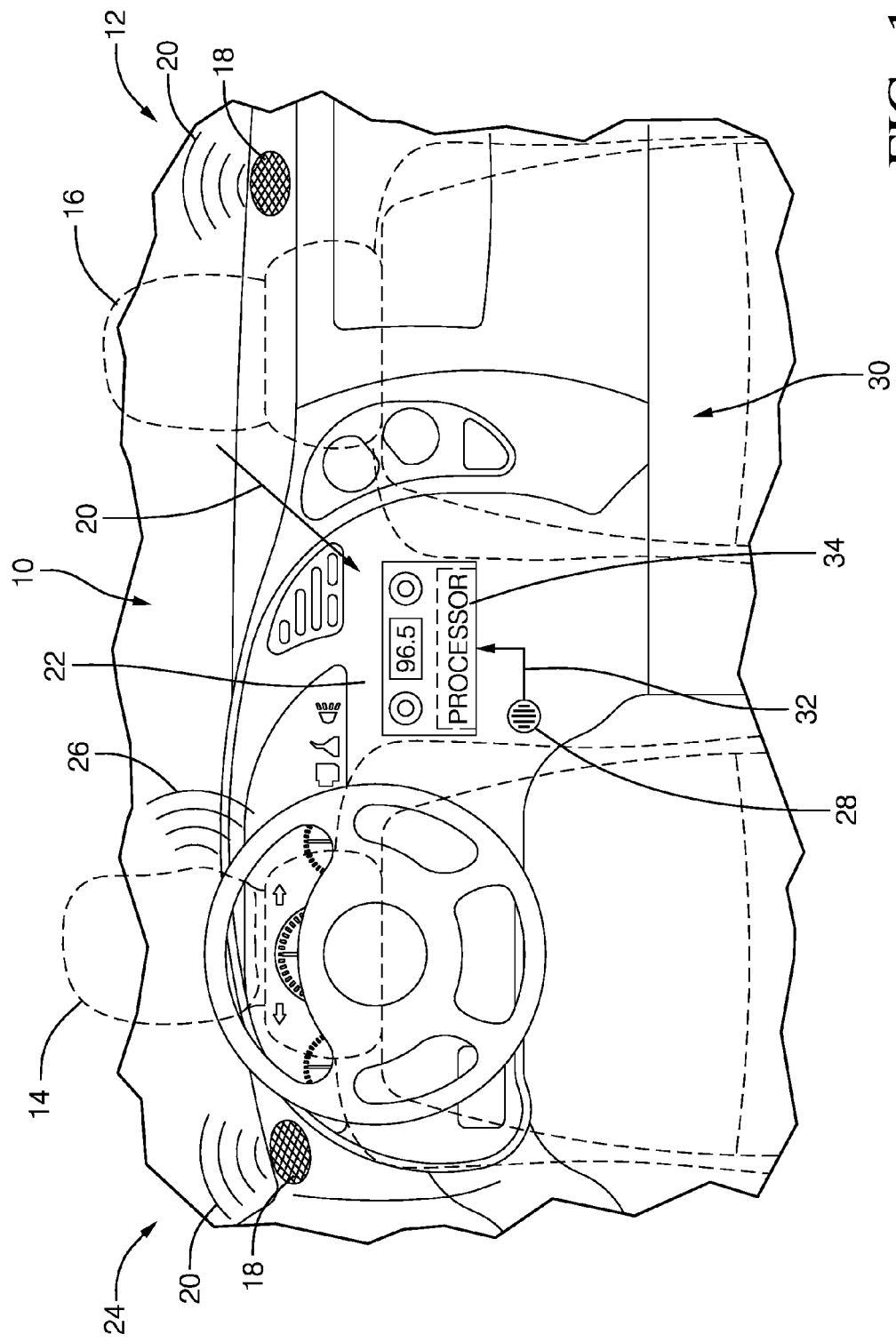
FIG. 1 is a cut-away view of a vehicle equipped with an entertainment system in accordance with one embodiment.

FIG. 1 illustrates a non-limiting example of an entertainment system, hereafter the system 10, suitable for use in a vehicle 12. In general, the system 10 is provided to provide entertainment such as music or news broadcasts to the operator 14 and/or passenger 16 of the vehicle 12. The system 10 includes one or more speakers 18 that output sound 20 in response to electric signals received by the speakers 18. The system may include a control unit 22 with control knobs or other means for the operator 14 and/or passenger 16 to select from various sources of entertainment (e.g. broadcasts, pre-recorded music, etc.; see the source 54, FIG. 2) and vary an output volume 24 of the sound 20 produced by the system 10.

In general, the system 10 described herein is configured to automatically vary or control the output volume 24 of the system 10 based on a detection of human speech 26 in a cabin 30 of the vehicle 12. As used herein, the term human speech means speech sounds produced or emitted by occupants of the vehicle 12 (e.g. the operator 14 and/or the passenger 16, and excludes speaking sounds emitted by the speakers 18 (e.g. a voice of a news broadcaster), as will become apparent in the description that follows.

The system includes a microphone 28 configured to detect sound in the cabin 30, and output a microphone signal 32 indicative of sound detected by the microphone 28. The system 10 includes a processor 34, which may be conveniently located in the control unit 22. The processor 34 may be a microprocessor or other control circuitry such as analog and/or digital control circuitry including an application specific integrated circuit (ASIC) for processing data, as should be evident to those in the art. The processor 34 may include memory, including non-volatile memory, such as electrically erasable programmable read-only memory (EEPROM) for storing one or more routines, thresholds and captured data. The one or more routines may be executed by the processor 34 to perform steps for determining if signals received by the processor 34 indicate that the output volume 24 of the system 10 should be adjusted as described herein.

Figure 2:
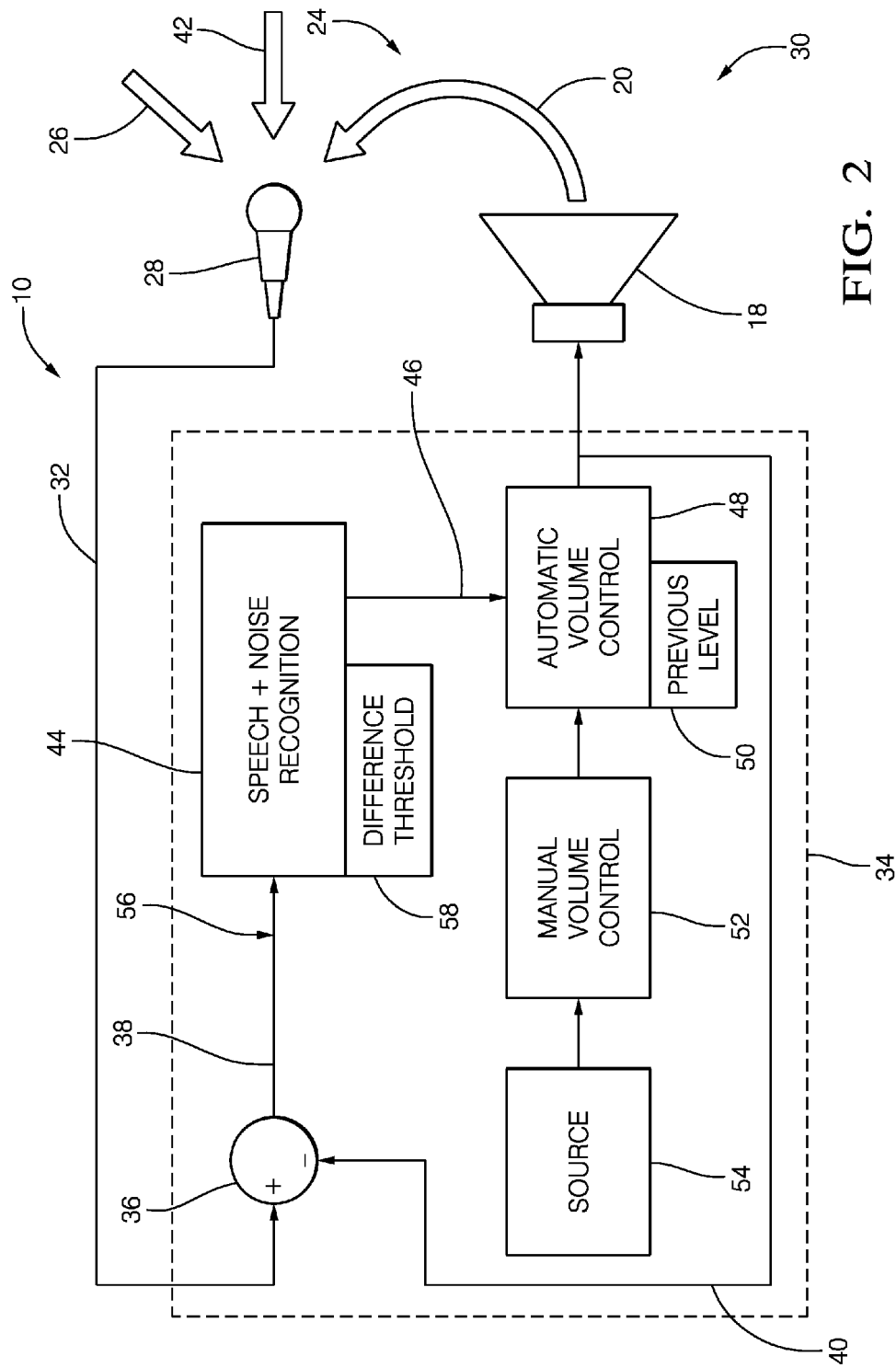
FIG. 2 is a diagram of the system of FIG. 1 in accordance with one embodiment.

FIG. 2 further illustrates non-limiting features of the system 10. The processor 34 may include an inverter/summer 36 so that the processor 34 is configured to determine a difference signal 38 based on a difference between the microphone signal 32 and an output signal 40 that corresponds to the sound 20 being output by the speakers 18 of the system 10. The difference signal 38 will have the portion of the microphone signal 32 that is due to the sound 20 removed so that what remains is, for the most part, the human speech 26 (if there is any) and noise 42 from the vehicle 12, as will be recognized by those in the art. The noise 42 may be caused by, but not limited to, noise from the engine of the vehicle 12, wind noise as the vehicle 12 travels through the atmosphere, or road noise caused by the tires of the vehicle interacting with the roadway surface. While the illustration of the processor 34 may appear to be more of a signal-path diagram, it is contemplated that the processor 34 could be or include a general purpose microprocessor programmed to mimic the signal-path diagram.

The processor 34 may include a speech/noise detector 44 configured to determine if the difference signal 38 corresponds to human speech 26. Once the portion of the microphone signal 32 that corresponds to the sound 20 is removed or cancelled by the inverter/summer 36, the speech/noise detector 44 can more readily determine if the human speech 26 is actually present. If the speech/noise detector 44 detects the human speech 26, the speech/noise detector 44 outputs a control signal 46 to an automatic volume control 48. If the control signal indicates that the speech/noise detector 44 has detected human speech 26 in the cabin 30, the automatic volume control 48 decreases the magnitude of the output signal 40. The output signal 40 is decreased such that the output volume is decreased by, for example, five decibel (5 dB), or by a value selected so the human speech 26 is, for example, 3 dB louder than the sound 20. As such, the processor 34 is configured to decrease the output volume 24 of the system 10 when the difference signal 38 corresponds to human speech 26.

Non-limiting examples of the human speech 26 include, but are not limited to, a conversation between the operator 14 and the passenger 16, a conversation between the operator 14 and a person outside of the cabin 30 such as a toll booth operator, or a phone conversation between the operator 14 and/or the passenger 16, and a person not located in the cabin 30. While the difference signal 38 may include the noise 42, there are known noise reduction techniques used by known speech recognition algorithms.

After the human speech 26 is detected, the system 10 or the processor 34 may be further configure to increase the output volume 24 to a previous level 50 a delay time (not shown) after the speech/noise detector 44 indicates that the human speech 26 has stopped. For example, the automatic volume control 48 may be configured to store the previous level 50 of the output signal 40 prior to the control signal 46 indicating that the human speech 26 had been detected, and after the control signal indicates that no human speech is being detected, the automatic volume control 48 may return or increase the output signal 40 back to the level that was present prior to the human speech 26 being detected. In order to avoid frequent increases and decreases of the output volume 24, the automatic volume control 48 may be configured to wait a delay time, five seconds (5 s) for example before returning the output signal 40 to the previous level 50, or the level indicated by the output of the manual volume control 52. Furthermore, when the output signal 40 is increased, it may be done slowly so there is not a sudden change in the output volume 24.

It may also be desirable to increase the output volume 24 if the noise 42 suddenly increases when, for example, the vehicle 12 is passing or traveling adjacent to a large truck, or the fan-speed on the vehicle air-conditioner increases. Accordingly, the system 10 or the processor 34 may be further configure to determine a difference magnitude 56 of the difference signal 38 if the difference signal 38 does not correspond to human speech 26, and increase the output volume 24 of the system 10 when the difference signal 38 does not correspond to human speech 26 and the difference magnitude 56 is greater than or increases by more than a difference threshold 58. The difference magnitude 56 is typically a value that can, for example, be calculated by the speech/noise detector 44, and compared to the difference threshold 58 which may be stored by the speech/noise detector 44 or elsewhere in the processor 34. It is also contemplated that if the level of the noise 42 decreases back to a level similar to the noise level when the manual volume control 52 was last adjusted, the level of the output signal 40 could also be decreased, i.e. returned to the previous level 50. It is contemplated that the previous level 50 may be adjusted each time a change in the output volume 24 is made by the operator 14 or the passenger 16 adjusting the manual volume control 52 by operating a volume control knob on the control unit 22.

Figure 3:
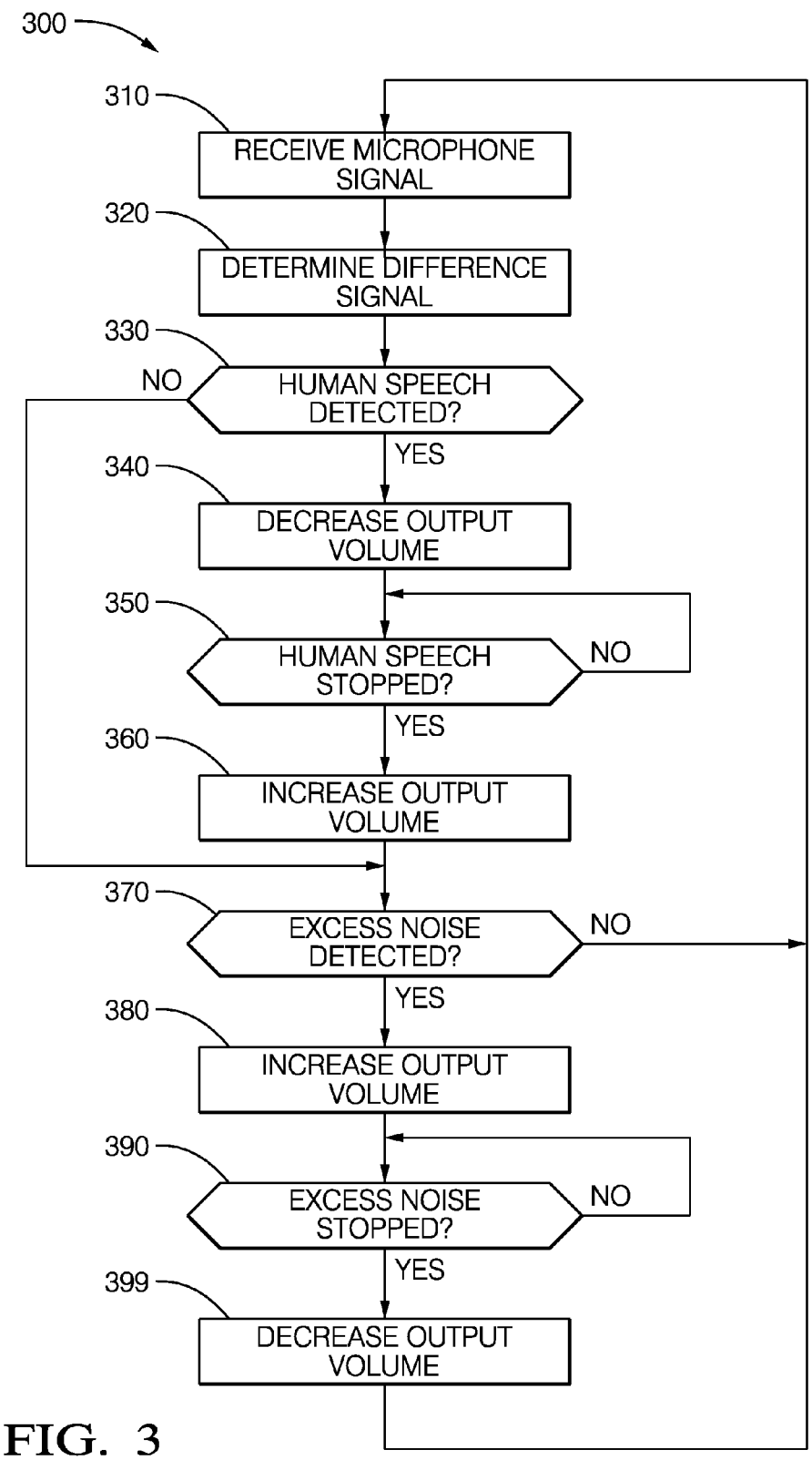
FIG. 3 is a flowchart of a method to operate the system of FIG. 1 in accordance with one embodiment.

FIG. 3 illustrates a non-limiting example of a method 300 for controlling an output volume 24 of an entertainment system (the system 10) suitable for use in a vehicle 12. As will be described in more detail, the system 10 is configured to temporarily decrease the output volume 24 of the system if human speech 26 is detected, and optionally increase the output volume 24 temporarily if there is an excessive increase in the level of the noise 42 in the cabin 30.

Step 310, RECEIVE MICROPHONE SIGNAL, may include providing a microphone 28 configured to detect sound in a cabin 30 of a vehicle 12, and receiving a microphone signal 32 from the microphone 28.

Step 320, DETERMINE DIFFERENCE SIGNAL, may include determining a difference signal 38 based on a difference between the microphone signal 32 and an output signal 40 corresponding to sound 20 being output by the system 10. The sound 20 being output by the system 10 is characterized by an output volume 24, as will be recognized by those in the art.

Step 330, HUMAN SPEECH DETECTED?, may include determining if the difference signal 38 corresponds to human speech 26. This determination may include filtering the difference signal 38 to accentuate the portion of the difference signal spectrum where the human speech is expected, and applying known speech recognition algorithms in order to detect the human speech 26. By way of further explanation and not limitation, the system 10 is using the speech/noise detector 44 to determine if the difference signal 38 includes human speech, but not necessarily what is being said. That is, the system 10 does not need to determine the specific words that are being spoken, only that something is being said. As such, those in the art will recognize that the computation burden for detecting that something is being said is less than for determining what words are being said.

Step 340, DECREASE OUTPUT VOLUME, may include decreasing the output volume 24 of the system 10 when the difference signal 38 corresponds to human speech 26. The output volume 24 may be decreased by the automatic volume control reducing the gain of the signal from the source 54 passing through the automatic volume control 48, i.e. offsetting the gain applied by the manual volume control 52.

Step 350, HUMAN SPEECH STOPPED?, may include the speech/noise detector outputting the control signal 46 to indicate that no human speech 26 has been detected in the difference signal 38. By way of further example, once the human speech 26 is detected and the output volume 24 has been decreased, the output volume 24 remains reduced until the speech/noise detector 44 determines that the human speech 26 has stopped.

Step 360, INCREASE OUTPUT VOLUME, may include increasing the output volume 24 to a previous level 50 a delay time after the difference signal 38 indicates that human speech 26 has stopped. The delay time may be a variable stored or wired into the automatic volume control 48. Alternatively, the delay time may be applied by the speech/noise detector 44. The delay time may be fixed, five seconds (5 s) for example, or may be adaptive depending on patterns detected in the human speech 26. For example, if frequent periods of human speech are interspaced with no human speech, it may be that the operator 14 or the passenger 16 is engaged in a phone conversation, so the delay time may be increased to a larger value, 30 s for example, so that the output signal is not increased to the previous level 50 until it is very likely that the phone conversation has ended.

In one example of the system 10, the processor 34 may be configured to perform only steps 310-360, so once the step 360 is performed, the method 300 would loop back to step 310. Alternatively, the system 10 may also be configured to temporarily increase the output volume 24 if the noise 42 increases by more than some threshold value because, for example, the roadway roughness increased causing an increase in the noise 42, or the vehicle 12 is passing a large truck traveling in an adjacent lane of the roadway. The steps for temporarily increasing the output volume 24 in response to an increase in the level of the noise 42 are shown in steps 370-399.

Step 370, EXCESS NOISE DETECTED?, may include determining a difference magnitude 56 of the difference signal 38 if the difference signal 38 does not correspond to human speech 26. The difference magnitude 56 may be always calculated by the speech/noise detector 44, but the usefulness of the difference magnitude 56 is especially useful to adjust the output volume 24 for sudden or temporary increased in the level of the noise 42.

Step 380, INCREASE OUTPUT VOLUME, may include increasing the output volume 24 of the system 10 when the difference signal 38 does not correspond to human speech 26, and the difference magnitude 56 is greater than a difference threshold 58. By way of example and not limitation, the output volume 24 may be increased so the sound 20 is at least equal to the noise 42. It is contemplated that the amount of increase of the output volume 24 may be varied depending on the level of the noise 42. For example, if the output volume 24 is already a relatively larger value when compared to ambient noise, and the noise 42 increases, the increase in the output volume may be small to avoid subjecting the operator 14 and passenger 16 to excessive sound pressure levels. However, if the output volume 24 is set by the manual volume control 52 to be close to the noise level, an increase in the noise 42 may be responded to with an equivalent increase in the output volume 24. As another example, the system 10 may detect the noise 42 at the time of the last change to the manual volume control 52 adjustment and use the relationship between the noise 42 and the manual volume control 52 setting to increase or decrease the output volume 24 to maintain that relationship when the difference signal 38 does not correspond to human speech 26. As another example, the system 10 may be configured to store the level of the noise 42 when the operator 14 last adjusted the manual volume control 52, and make adjustments to the output signal 40 via the automatic volume control 48 to maintain a consistent difference in levels between the noise 42 and output volume 24. In this way the output volume 24 would be compensated for changes in, for example, the noise generated by changes in blower speed of the vehicle HVAC system.

Step 390, EXCESS NOISE STOPPED?, may include analyzing the difference signal 38 by the speech/noise detector 44 to determine that the previously detected increase in the noise 42 has subsided, and providing a control signal 46 that indicates the automatic volume control should return to the previous level 50.

Step 399, DECREASE OUTPUT VOLUME, may include the automatic volume control 48 lowering the output volume 24 as soon as the noise 42 is reduced, i.e. without the delay time used for step 360, so that the output volume 24 returns to the level desired by the operator 14 (e.g. indicated by the manual volume control 52) as soon as possible.

Accordingly, an entertainment system (the system 10), a processor 34 for the system 10, and a method 300 of operating the system 10 is provided. These operate to temporarily decrease the output volume 24 if human speech 26 is detected that is not included in the sound 20. Optionally, these operate to temporarily increase the output volume 24 if the level of the noise 42 increases by more than the difference threshold 58. Once the conditions that caused the increase or decrease cease, e.g. no human speech is detected or the noise 42 returns to previous noise levels, the output volume 24 is returned to the previous level 50.

While this invention has been described in terms of the preferred embodiments thereof, it is not intended to be so limited, but rather only to the extent set forth in the claims that follow.

I claim:

1. An entertainment system suitable for use in a vehicle, said system configured to control an output volume of the system, said system comprising:
    a microphone configured to detect sound in a cabin of the vehicle, and output a microphone signal indicative of the sound;
    a processor configured to determine a difference signal based on a difference between the microphone signal and an output signal corresponding to sound being output by the system, determine if the difference signal corresponds to human speech, and decrease the output volume of the system when the difference signal corresponds to human speech, determine a difference magnitude of the difference signal if the difference signal does not correspond to human speech, and increase the output volume of the system when the difference signal does not correspond to human speech and the difference magnitude is greater than a difference threshold.

2. The system in accordance with claim 1, wherein the processor is further configured to increase the output volume to a previous level a delay time after the difference signal indicates that human speech has stopped.

3. A method for controlling an output volume of an entertainment system suitable for use in a vehicle, said method comprising the steps of:
    receiving a microphone signal from a microphone configured to detect sound in a cabin of the vehicle;
    determining a difference signal based on a difference between the microphone signal and an output signal corresponding to sound being output by the system, wherein the sound being output by the system is characterized by an output volume;
    determining if the difference signal corresponds to human speech; and
    decreasing the output volume of the system when the difference signal corresponds to human speech;
    determining a difference magnitude of the difference signal if the difference signal does not correspond to human speech; and
    increasing the output volume of the system when the difference signal does not correspond to human speech and the difference magnitude is greater than a difference threshold.

4. The method in accordance with claim 2, wherein the method further comprises the step of
    increasing the output volume to a previous level a delay time after the difference signal indicates that human speech has stopped.

* * * * *